US010297708B1

United States Patent
Ariyawansa et al.

(10) Patent No.: US 10,297,708 B1
(45) Date of Patent: May 21, 2019

(54) SURFACE PASSIVATION FOR PHOTODETECTOR APPLICATIONS

(71) Applicant: The United States of America, as represented by the Secretary of the Air Force, Washington, DC (US)

(72) Inventors: Gamini Ariyawansa, Dayton, OH (US); Joshua M. Duran, Dayton, OH (US); Charles J. Reyner, Mason, OH (US); John E. Scheihing, Yellow Springs, OH (US)

(73) Assignee: The United States of America, as represented by the Secretary of the Air Force, Washington, DC (US)

( * ) Notice: Subject to any disclaimer, the term of this patent is extended or adjusted under 35 U.S.C. 154(b) by 0 days.

(21) Appl. No.: 15/879,481

(22) Filed: Jan. 25, 2018

(51) Int. Cl.
| | |
|---|---|
| *H01L 27/14* | (2006.01) |
| *H01L 31/00* | (2006.01) |
| *H01L 31/18* | (2006.01) |
| *H01L 31/101* | (2006.01) |
| *H01L 31/0352* | (2006.01) |
| *H01L 31/0304* | (2006.01) |

(52) U.S. Cl.
CPC .... *H01L 31/1868* (2013.01); *H01L 31/03046* (2013.01); *H01L 31/035281* (2013.01); *H01L 31/101* (2013.01); *H01L 31/1864* (2013.01)

(58) Field of Classification Search
CPC ........... H01L 31/1868; H01L 31/03046; H01L 31/035281; H01L 31/101; H01L 31/1864
USPC ......................................................... 257/431
See application file for complete search history.

(56) References Cited

U.S. PATENT DOCUMENTS

| | | |
|---|---|---|
| 5,116,781 A | 5/1992 | Agostinelli et al. |
| 7,001,794 B2 | 2/2006 | Razeghi |
| 7,375,378 B2 | 5/2008 | Manivannan et al. |
| 7,682,865 B2 | 3/2010 | Razeghi |
| 7,689,054 B1 | 3/2010 | Repperger et al. |
| 7,955,992 B2 | 6/2011 | Chen et al. |
| 8,217,480 B2 | 7/2012 | Ting et al. |
| 9,018,727 B2 | 4/2015 | Ni |
| 9,199,676 B2 | 12/2015 | Brown et al. |
| 9,276,162 B2 | 3/2016 | Yasuoka et al. |
| 9,613,999 B2 | 4/2017 | Klipstein et al. |
| 2003/0000454 A1 | 1/2003 | Suh et al. |
| 2003/0071221 A1 | 4/2003 | Mitra |
| 2004/0008947 A1 | 1/2004 | Yamabayashi et al. |
| 2004/0175860 A1 | 9/2004 | Park et al. |
| 2006/0105554 A1 | 5/2006 | Inada |
| 2006/0145190 A1 | 7/2006 | Salzman et al. |
| 2007/0282575 A1 | 12/2007 | Gossage |
| 2008/0220598 A1 | 9/2008 | Ben-Michael et al. |
| 2009/0045395 A1 | 2/2009 | Kim et al. |

(Continued)

*Primary Examiner* — David S Blum
(74) *Attorney, Agent, or Firm* — AFMCLO/JAZ; Timothy Barlow

(57) ABSTRACT

A photodetector includes a detector material having an upper layer, a lower layer, and at least one sidewall. Also included as part of the photodetector are a first contact electrically coupled to the detector material through the upper layer and a second contact electrically coupled to the detector material through the lower layer. Diffused into the sidewall by a passivation process is a dopant material operable to electrically isolate the first contact from the second contact via the sidewall. The dopant material is provided by a passivation layer deposited on the sidewall.

19 Claims, 8 Drawing Sheets

(56) References Cited

U.S. PATENT DOCUMENTS

| | | |
|---|---|---|
| 2009/0165855 A1 | 7/2009 | Sun et al. |
| 2009/0230497 A1 | 9/2009 | Gao et al. |
| 2009/0302309 A1 | 12/2009 | Razeghi |
| 2011/0146136 A1 | 7/2011 | Nagai et al. |
| 2012/0148132 A1 | 6/2012 | Counch et al. |
| 2012/0264254 A1 | 10/2012 | Wan |
| 2013/0255762 A1 | 10/2013 | Fang et al. |
| 2014/0144497 A1 | 5/2014 | Kim et al. |
| 2014/0352786 A1 | 12/2014 | Lee et al. |
| 2015/0206998 A1 | 7/2015 | Kapur et al. |
| 2015/0236175 A1 | 8/2015 | Kapur et al. |
| 2015/0372047 A1 | 12/2015 | Ni |
| 2017/0345958 A1* | 11/2017 | Meyer ............... H01L 31/02161 |

\* cited by examiner

US 10,297,708 B1

SURFACE PASSIVATION FOR PHOTODETECTOR APPLICATIONS

GOVERNMENT INTEREST

The invention described herein may be manufactured and used by or for the Government of the United States for all governmental purposes without the payment of any royalty.

FIELD OF THE INVENTION

The present invention relates to photodetectors, such as infrared detectors, and methods of manufacturing the same.

BACKGROUND

Manufacturing a photodetector device often exposes the device to processes, materials, and techniques that result in limiting their operating range or hindering their performance. For example, a photodetector may comprise a combination of p-type and n-type semiconductor materials, with each material offering different electrical properties that work in combination to provide a functional device. The steps by which these devices are fabricated, however, can alter these materials in ways that affect the device's operation. An infrared detector is a notable example of how the steps in the fabrication process can cause these effects.

Infrared detectors can be fabricated using an infrared absorbing semiconductor material, referred to as "absorption material", that offers an electrical path through which, when the device is operating, bulk electrical current will flow. The bulk electrical current is typically used as an environmental indicator of when the device is exposed to an environment having infrared energy. When fabricating these devices, though, the dry and wet chemical etching processes used can alter the semiconductor absorption material at the surface. More specifically, these processes can create a conductive surface layer that bypasses the path through which bulk electrical current should flow. In such instances, the device will be characterized by the surface leakage current flowing through the conductive surface layer rather than the bulk current that should be flowing through the semiconductor absorption material. Consequently, surface leakage current can become a significant concern because it hinders the device's reliable operation.

The challenges posed by surface leakage current can be particularly prevalent in photodetector devices using p-type absorption materials, where the etching process results in "pinning" at the surface. The term "pinning" is used to describe the bending of conduction and valence bands similar to what happens in the depletion region of a "pin" diode. This pinning, in turn, leads to an accumulation of electrons near the surface such that the p-type material becomes an n-type material. This change in doping type creates what is known as a "surface inversion" where the concentration of dopants is higher at the surface where the n-type material is prevalent and lessens as one moves deeper into the absorption material until the p-type material is prevalent. This surface inversion defines the surface layer. What is needed in such devices is an ability to convert the n-type material at the surface layer back to a p-type material, and vice versa when the absorption material is an n-type material.

A variety of techniques known in the art have attempted to compensate for these effects, some of which have employed a type of passivation layer as a protective film. Such passivation layers are typically not doped. Indeed, as indicated in U.S. Pat. No. 9,276,162 to Yasuoka et al. (hereinafter "Yasuoka"), deposited passivation layers on the sidewall of a photodetector are comprised of, for instance, undoped indium phosphide. In addition to being undoped, such a passivation layer has the disadvantage of having to be epitaxially regrown on the photodetector, requiring a second deposition process and thereby resulting in a more complicated and less flexible fabrication process than if alternative methods, including various deposition techniques, were available.

Additionally, Yasuoka teaches a process of diffusing zinc from a top of a mesa structure defined by an insulator mask into the side areas of a multiplication region, as opposed to into a surface layer directly. When employed, such techniques tend to reduce the thickness of the multiplication region and increase the breakdown field at the edges of the mesa structure. These effects further tend to increase the residual electric current flowing through the photodiode when no incident electromagnetic radiation is present (i.e., dark current). Such techniques, however, do not address the pinning phenomenon described above because they are unable to diffuse a dopant across a junction of the depth necessary to limit surface leakage current. Moreover, if mesa fabrication is performed after dopant diffusion, then chemical etching can still be required as part of the fabrication process, and when employed, this etching will tend to convert the side areas back to an n-type material as described above.

Accordingly, there is a need in the art to compensate for the effects of the fabrication process on the reliability and operation of photodetectors. More specifically, there is a need to passivate a surface layer in a photodetector device to reduce surface leakage current and/or dark current that would hinder device performance, particularly in those devices that utilize p-type semiconductors as an absorption material. This passivation could be done as part of a post-fabrication process or in conjunction with other fabrication steps.

This background information is provided to reveal information believed by the applicant to be of possible relevance to the present invention. No admission is necessarily intended, nor should be construed, that any of the preceding information constitutes prior art against the present invention.

SUMMARY OF THE INVENTION

With the above in mind, embodiments of the present invention are related to an infrared detector having a detector material comprising an upper layer, a lower layer, and at least one sidewall spanning the upper layer and the lower layer. The infrared detector may further comprise a first contact electrically coupled to the detector material through the upper layer and a second contact electrically coupled to the detector material through the lower layer. The sidewall may comprise a diffused dopant material operable to electrically isolate the first contact from the second contact via the sidewall. In some embodiments, the dopant may be thermally diffused from a passivation layer deposited on at least a portion of the sidewall.

In some embodiments, the detector material may comprise one of an n-type doped semiconductor, a p-type doped semiconductor, and an undoped semiconductor. Furthermore, the detector material may be a III-V bulk semiconductor selected from the group consisting of InAs, InGaAs, InAsSb, and InSb. In some embodiments, the detector material may be a type II superlattice formed using a semiconductor selected from the group consisting of InAs, GaSb, AlSb, InAsSb, InGaAs, InAlAs, AlAsSb, AlGaSb, and InAlSb.

In some embodiments, the dopant material may comprise one of a p-type dopant and an n-type dopant. Furthermore, the dopant material may comprise at least one of Zn, Al, Mg, Be, B, C, N, Si, P, S, and Te. Additionally, the dopant material may consist of at least one of Zn, Al, Mg, Be, B, C, N, Si, P, S, and Te.

Additionally, embodiments of the present invention may be directed to a method of passivating an infrared detector comprising a detector material having a sidewall, the method comprising providing an infrared detector characterized by a surface leakage current; depositing a passivation layer comprising a passivation material onto at least a portion of the sidewall; and diffusing a dopant material comprised by the passivation material into the detector material. The dopant material diffused into the detector material may reduce the surface leakage current.

In some embodiments, the passivation material may comprise one of a p-type dopant and an n-type dopant. Furthermore, the passivation material may comprise one of ZnO, ZnS, MgO, $Al_2O_3$, AlN, $SiO2$, $Si_xN_y$, and $HfO_2$. Additionally, the passivation material may consist of one of ZnO, ZnS, MgO, $Al_2O_3$, AlN, $SiO2$, $Si_xN_y$, and $HfO_2$.

In some embodiments, the detector material may comprise one of an n-type doped semiconductor, a p-type doped semiconductor, and an undoped semiconductor. Furthermore, the detector material may be a III-V bulk semiconductor selected from the group consisting of InAs, InGaAs, InAsSb, and InSb. Additionally, the detector material may be a type II superlattice formed using a semiconductor selected from the group consisting of InAs, GaSb, AlSb, InAsSb, InGaAs, InAlAs, AlAsSb, AlGaSb, and InAlSb.

In some embodiments, the method may further comprise depositing the passivation layer by at least one of atomic layer deposition, pulsed laser deposition, chemical vapor deposition, plasma enhanced chemical vapor deposition, vapor coating, thermal evaporation, and sputtering. In some embodiments, the method may further comprise diffusing the dopant material from the passivation layer by at least one of thermal annealing, ion implantation, heating in an ampoule under vacuum, and heating the infrared detector in an oven/furnace in an inert gas environment. The thermal annealing may comprise heating the passivation layer to a temperature within a range from 100 degrees C. to 600 degrees C. Additionally, thermal annealing comprises heating the passivation layer to about 500 degrees C. for a period of one minute in a nitrogen environment.

In some embodiments, the method may further comprise removing the passivation layer by at least one of wet etching and dry etching. Additionally, a portion of the sidewall may not have the passivation layer deposited thereon.

Additionally, embodiments of the present invention may be directed to an infrared detector or other type of photodetector comprising a detector material comprising an upper layer, a lower layer, and at least one sidewall. The infrared detector may further comprise a first contact electrically coupled to the detector material through the upper layer and a second contact electrically coupled to the detector material through the lower layer. The sidewall may comprise an n-type doped semiconductor, and a thermally diffused p-type dopant material operable to electrically isolate the first contact from the second contact via the sidewall.

According to a further embodiment, a photodetector comprises an absorption material characterized by a bulk electrical current; a surface layer characterized by a surface leakage current; and a dopant material diffused into the surface layer from a passivation layer, the dopant material being operable to reduce surface leakage current in the surface layer.

DETAILED DESCRIPTION OF THE INVENTION

Figure 1:
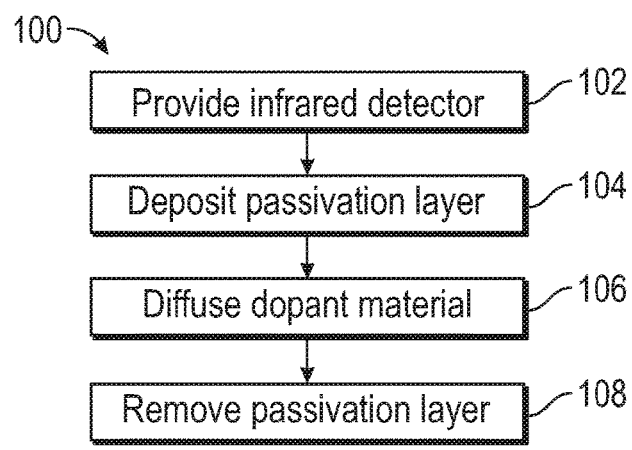
FIG. 1 is a flowchart illustrating a method of manufacturing an infrared detector with a passivated sidewall according to an embodiment of the present invention.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Those of ordinary skill in the art realize that the following descriptions of the embodiments of the present invention are illustrative and are not intended to be limiting in any way. Other embodiments of the present invention will readily suggest themselves to such skilled persons having the benefit of this disclosure. Like numbers refer to like elements throughout.

Although the following detailed description contains many specifics for the purposes of illustration, anyone of ordinary skill in the art will appreciate that many variations and alterations to the following details are within the scope of the invention. Accordingly, the following embodiments of the invention are set forth without any loss of generality to, and without imposing limitations upon, the claimed invention.

In this detailed description of the present invention, a person skilled in the art should note that directional terms, such as "above," "below," "upper," "lower," and other like terms are used for the convenience of the reader in reference to the drawings. Also, a person skilled in the art should notice this description may contain other terminology to convey position, orientation, and direction without departing from the principles of the present invention.

Furthermore, in this detailed description, a person skilled in the art should note that quantitative qualifying terms such as "generally," "substantially," "mostly," and other terms are used, in general, to mean that the referred to object, characteristic, or quality constitutes a majority of the subject of the reference. The meaning of any of these terms is dependent upon the context within which it is used, and the meaning may be expressly modified.

Embodiments of the present disclosure are directed to passivating a surface layer in a photodetector device and to such devices having a passivated surface layer. The surface layer may be characterized by a surface leakage current such that, when the device is subjected to an electrical bias, a bulk current electrical path in the device passing through a semiconductor absorption material would be bypassed but for the passivation of the surface layer. As disclosed in this invention, passivation may occur via a passivation process comprising a deposition process and a diffusion process. As part of the deposition process, a passivation layer having a dopant material may be applied to all or a portion of the surface layer at a pre-determined thickness, as explained below. As part of the diffusion process, the dopant material is diffused from the passivation layer into the surface layer such that the surface leakage current is reduced or eliminated following diffusion of the dopant material into the surface layer. Diffusion of the dopant material into the surface layer may be at a pre-determined depth and a pre-determined concentration, as explained below. Once the passivation process is complete, the passivation layer may be removed or retained as part of a post-fabrication process for passivating the photodetector device.

Exemplary embodiments may be directed to an infrared detector device in a reticulated arrangement (FIG. 2A) and having a mesa-like geometry. The device can include a first electrical contact, a second electrical contact, and a sidewall spanning one or more layers of an absorption material (i.e., detector material). The sidewall may provide an electrical path between the first electrical contact and the second electrical contact and may be characterized by a surface leakage current, such as may result due to one or more fabrication steps as described above. The absorption material may provide another electrical path between the first electrical contact and the second electrical contact and may be characterized by a bulk electrical current. The sidewall may include a dopant material that has been diffused into the sidewall and may be configured to reduce or eliminate surface leakage current through the sidewall. The dopant material may be diffused into the sidewall from a passivation layer deposited along all or a portion of the sidewall. Diffusion of the dopant material may be at a predetermined depth and a predetermined concentration into the sidewall via a diffusion process.

Referring now to the figures and the accompanying text, and particularly FIG. 1, a method 100 of manufacturing a photodetector having a passivated surface layer is provided. Starting at block 102, the method 100 may comprise providing a photodetector comprising a detector material having a surface layer characterized by a surface leakage current. In some embodiments, the detector material may comprise one of an n-type doped semiconductor, a p-type doped semiconductor, and an undoped semiconductor. Additionally, the detector material may comprise a group III-V bulk semiconductor selected from the group consisting of indium arsenide (InAs), indium gallium arsenide (InGaAs), indium arsenide antimonide (InAsSb), and indium antimonide (InSb). Alternatively, the detector material may comprise a type II superlattice formed using a semiconductor selected from the group consisting of InAs, gallium antimonide (GaSb), InAsSb, InGaAs, aluminum arsenide antimonide (AlAsSb), aluminum gallium antimonide (AlGaSb), and indium aluminum antimonide (InAlSb).

The method 100 may further comprise depositing a passivation layer comprising a dopant material onto the surface layer of the photodetector at block 104. In some embodiments, the passivation layer may be deposited over an entirety of the surface layer. In others, the passivation layer may be deposited over only a portion of the surface layer. The passivation material may be deposited at a predetermined thickness, at selected portions of the surface layer, or subsequently patterned according to where the dopant material contained within the passivation material is to be diffused. The thickness of the passivation layer may range from a few atomic layers to about a few hundred nanometers, but the thickness of the passivation layer may be less important than ensuring relatively uniform coverage over the portions of the surface layer in which the dopant material is to be diffused. The surface layer should be free of other materials such as residues, oxides, and contaminants, such that good contact between the surface layer and the passivation layer is made.

In some embodiments, the passivation material may comprise one of a p-type dopant and an n-type dopant. More specifically, the passivation material may comprise one of zinc oxide (ZnO), zinc sulfide (ZnS), magnesium oxide (MgO), aluminum oxide ($Al_2O_3$), aluminum nitride (AlN), silicon dioxide (SiO2), silicon nitride ($Si_xN_y$), and hafnium oxide ($HfO_2$). In some embodiments, the passivation material may consist of one of ZnO, ZnS, MgO, $Al_2O_3$, AlN, SiO2, $Si_xN_y$, and $HfO_2$. It will be appreciated that the choice of materials comprising the passivation layer, and by extension the dopant material contained therein, may be based on the properties of the detector material. For example, when the detector material is a p-type material from group III-V, ZnO may be selected as the passivation material. In such embodiments, Zn may act as the p-type dopant to be diffused into the surface layer, and ZnO can provide a source of Zn for the dopant material.

Any deposition process known in the art is contemplated and may be included within the scope of the present disclosure when depositing a passivation layer at block 104. Exemplary deposition methods include, but are not limited to, atomic layer deposition (ALD), pulsed laser deposition (PLD), chemical vapor deposition (CVD), plasma enhanced chemical vapor deposition (PECVD), vapor coating, thermal evaporation, and sputtering. The deposition process may be selected according to a variety of factors such as the desired passivation material and dopant, layer thickness, quality, uniformity, sidewall geometry, deposition time, deposition conditions, etc. For example, when depositing a passivation layer of ZnO, ALD may provide a suitable process for ensuring uniform coverage of the passivation layer over the surface layer irrespective of the surface layer's profile. However, the thickness of the passivation layer, when ALD is used, can be typically limited to a few tens of nanometers. If a thicker ZnO passivation layer is desired, PLD may be used, which also allows for deposition at ambient temperatures.

The method 100 may continue at block 106 by diffusing the dopant material from the passivation layer into the surface layer of the photodetector. Diffusion of the dopant material into the surface layer may be at a pre-determined depth and a pre-determined doping concentration to reduce or eliminate surface leakage current in the surface layer. The depth of diffused dopants may be determined based on the thickness of the surface layer; preferably the dopants should penetrate the entire thickness of the surface layer. The target doping concentration in the surface layer may be the same as the bulk doping concentration of the absorbing material.

As the surface layer is inverted, the concentration of the diffused dopants may also be higher at some portions of the surface layer than the doping concentration of the bulk absorbing material. It will be appreciated that the optimum depth and the concentration may depend on the bulk absorbing material and the surface layer profile, which may be experimentally determined.

Any diffusion process known in the art for diffusing a dopant material from one layer into a semiconductor material is contemplated and included within the scope of the invention. Some exemplary diffusion processes include, thermal annealing, ion implantation, heating the infrared detector in an ampoule in a vacuum, and heating the infrared detector in an oven/furnace in an inert gas environment. The choice of the diffusion process primarily depends on the bulk absorbing material, passivation material, and the dopant material. The conditions of the diffusion process and process parameters (e.g., temperature and time) should be compatible with the absorbing material such that the crystalline quality of the absorbing material is not impacted. Rapid thermal annealing may facilitate heating the sample to a high temperature for a very short period of time, which is compatible with most of III-V semiconductor absorbing materials and dopant materials. When a more moderate temperature is required but for a longer period of time, heating in an ampoule may be employed.

In some embodiments, the dopant material may be diffused into the surface layer material using a thermal annealing process that comprises heating the passivation layer to a temperature within a range from about 100 degrees C. to about 600 degrees C. In some embodiments, the thermal annealing may comprise heating the passivation layer using rapid thermal annealing to a temperature of about 500 degrees C. for a period of one minute. Additionally, the thermal annealing may be performed in a nitrogen environment. When rapid thermal annealing is used, the specified temperature is the temperature the device is heated to. When the process includes heating in an ampoule, the temperature specified is the temperature in the chamber and the surrounding of the sample.

Additionally, the method 100 may optionally further comprise removing at least a portion of the passivation layer by at least one of wet etching and dry chemical etching at block 108. In some embodiments, the entire passivation layer may be removed. In other embodiments, this step may be omitted such that the passivation layer remains and may act as an encapsulation layer. Furthermore, in between blocks 104 and 108, additional steps may be included directed to patterning and etching the passivation layer such that diffusion of the dopant materials is limited to selected portions of the surface layer. Patterning may be provided using standard photolithography and other techniques known within the art.

Referring now to FIGS. 2A-2D, an infrared detector 200 is provided according to present embodiments. The infrared detector 200 may, at least in part and in some embodiments, be fabricated using the method 100 described in conjunction with FIG. 1. As illustrated, the infrared detector 200 is configured in a photodiode architecture having a mesa-like configuration and comprising a p-type detector material 202. It will be appreciated, however, that other device structures are compatible with the teachings of the present disclosure. Such device structures can include a homojunction diode structure, heterojunction diode structure, a barrier structure, an nBn structure, a pBp structure, and a pBn structure.

The detector material 202 may be configured to absorb electromagnetic radiation within a wavelength band. In some embodiments, the detector material may be configured to absorb electromagnetic radiation within a wavelength range from 700 nanometers to 1 millimeter, referred to as infrared light. In some embodiments, the detector material 202 may be configured to absorb infrared light within a range from 0.7 micrometers (μm) to 3.5 μm, defined as short-wave infrared (SWIR), 3 μm to 5 μm, defined as mid-wave infrared (MWIR), 8 μm to 14 μm, defined as long-wave infrared (LWIR), and 14 μm to 1,000 μm, defined as very long wave infrared (VLWIR).

Figure 2A:
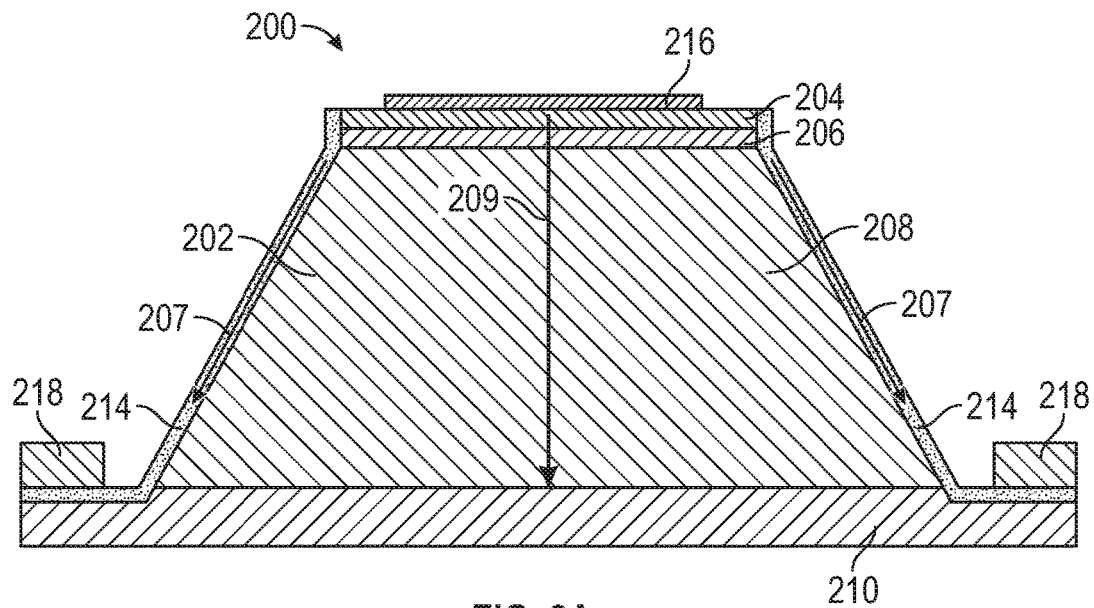
FIGS. 2A through 2D are diagrams illustrating a method of manufacturing an infrared detector according to an embodiment of the invention.

Referring now specifically to FIG. 2A, aspects of the infrared detector 200 will be discussed in greater detail. In the present embodiment, infrared detector 200 comprises a detector material 202 having an upper layer 204, a depletion/barrier layer 206, and an infrared absorption layer 208 positioned such that the depletion/barrier layer 206 is intermediate the upper layer 204 and the infrared absorption layer 208. The detector material 202 may further comprise a lower layer 210 positioned such that the infrared absorption layer 208 is intermediate the depletion/barrier layer 206 and the lower layer 210. At least one of the upper layer 204, the depletion/barrier layer 206, the infrared absorption layer 208, and the lower layer 210 may define a sidewall 214 of the detector material 202. In the present embodiment, the upper layer 204, the depletion/barrier layer 206, the infrared absorption layer 208, and the lower layer 210 each partially define the sidewall 214. It is contemplated and included within the scope of the invention that any one of the upper layer 204, the depletion/barrier layer 206, the infrared absorption layer 208, and the lower layer 210, and any sub-combination thereof, may define the sidewall 214.

As mentioned above, the infrared detector 200 may take the form of a variety of device structures, including the following:

a homojunction diode comprising an n-type semiconductor as the upper layer 204, a depleted semiconductor as the depletion/barrier layer 206, and a p-type semiconductor as the infrared absorption layer 208;

a heterojunction diode comprising an n-type first semiconductor material as the upper layer 204, an undoped first semiconductor material as the depletion/barrier layer 206 (i.e., is the same semiconductor material as the upper layer 204), and p-type second semiconductor material as the infrared absorption layer 208 (i.e., is a different semiconductor material than the upper layer 204 and the depletion/barrier layer 206); and a barrier structure, comprising any structure where the depletion/barrier layer 206 is a barrier layer, namely, a semiconductor with a relatively higher bandgap, including the following (barrier structures with 'B' referring to a 'barrier layer'):

an nBn structure, comprising an n-type semiconductor as the upper layer 204, an undoped or doped barrier as the depletion/barrier layer 206, and an n-type semiconductor as the infrared absorption layer 208;

a pBp structure comprising a p-type semiconductor as the upper layer 204, an undoped or doped barrier as the depletion/barrier layer 206, and a p-type semiconductor as the infrared absorption layer 208; and a nBp structure comprising an n-type semiconductor as the upper layer 204, an undoped or doped barrier as the depletion/barrier layer 206, and a p-type semiconductor as the infrared absorption layer 208.

Sidewall 214 may include a surface layer susceptible to surface leakage current 207 as a result of one or more steps used in the fabrication of infrared device 200. Surface leakage current is not desirable. The surface leakage current 207 may characterize the infrared detector 200 instead of a bulk current 209, which is intended to characterize the infrared detector 200. For example, infrared absorption layer 208 may be a p-type material selected from group III-V. As a result of an etching process to define the mesa-like configuration, sidewall 214 may include an n-type surface layer with a depth ranging from a few atomic layers to tenths of nanometers due to the pinning described above. Thus, sidewall 214 may be characterized as a thin conductive layer due to the accumulation of electrons in this region. In the illustrated embodiment, the sidewall 214 spans the upper layer 204, the depletion/barrier layer 206, the infrared absorption layer 208, and to the lower layer 210. It will be appreciated that in other embodiments, sidewall 214 may span other layers, or fewer layers, provided that its characteristics are consistent with those disclosed herein.

Detector material 202 may comprise other types of detector materials as well, such that at least a portion of detector material 202 is one of an n-type doped semiconductor, a p-type doped semiconductor, and an undoped semiconductor. For example, in some embodiments, the detector material 202 may comprise a group III-V bulk semiconductor selected from the group consisting of InAs, InGaAs, InAsSb, and InSb and having the device structure of infrared detector 202. In other embodiments, the detector structure of infrared detector 200 can be a pn diode structure, a pN heterojunction diode structure, an nBn barrier detector, or a pBp barrier structure. In these embodiments, and not necessarily these alone, the detector material 202 may comprise a type II superlattice formed using a semiconductor selected from the group consisting of InAs, GaSb, AlSb, InAsSb, InGaAs, InAlAs, AlAsSb, AlGaSb, and InAlSb. In all of these embodiments, the suppression of surface leakage current at a surface layer can be a challenge.

Additionally, the infrared detector 200 may further comprise a first electrical contact 216 and a second electrical contact 218 fabricated by the deposition of a metal or a stack of different metals. The first electrical contact 216 may be electrically coupled to the upper layer 204, and the second contact 218 may be electrically coupled to the lower layer 210. In this way, an electrical path for surface leakage current 207 can be formed from the electrical contacts 216, 218, the upper layer 204, the lower layer 210, and through the sidewall 214. Because sidewall 214 is characterized by a surface leakage current, it can compete with the electrical path for bulk current 209 through the upper layer 204, the depletion/barrier layer 206, the infrared absorption layer 208, and the lower layer 210.

Figure 2B:
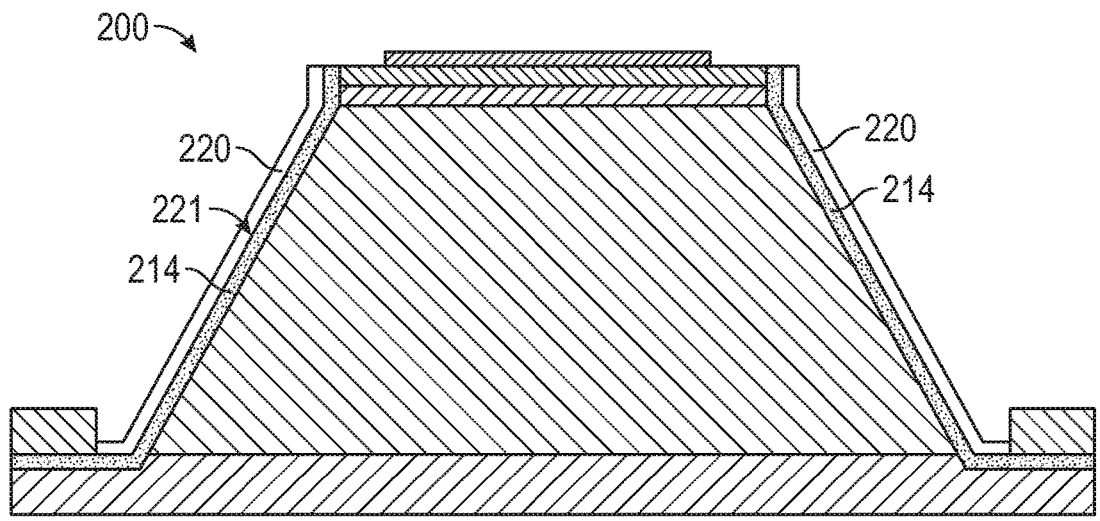

Referring now to FIG. 2B, the infrared detector 200 further comprises a passivation layer 220. The passivation layer 220 may be positioned along at least a portion of the sidewall 214 of the detector material 202. Alternatively, the passivation layer 220 may be positioned on any part of the infrared detector 200 where surface leakage current may be occurring or may occur. The passivation layer 220 may be positioned by any means or method described herein and at a predetermined thickness using an appropriate deposition process. As mentioned above, the thickness of the passivation layer 220 can range from a few atomic layers to about few hundred nanometers For example, in the illustrated embodiment, the passivation layer 220 may be uniformly deposited via an ALD process atop the entirety of the sidewall and at a thickness within the range from about 10 nanometers to about 60 nanometers. This predetermined thickness allows for a uniform coverage over the entire sidewall 214 irrespective of the sidewall shape and geometry.

Figure 2C:
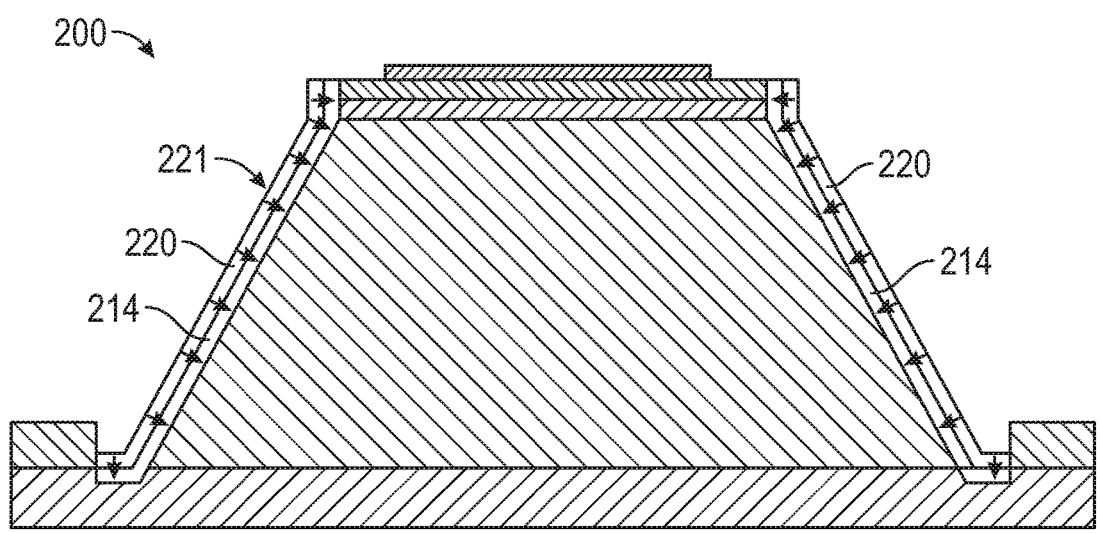

Referring now to FIG. 2C, the passivation layer 220 includes a dopant material 221. The dopant material 221 may be a part of the passivation layer 220 included for the purpose of being diffused (see arrows) into the detector material 202 so as to mitigate the occurrence of surface leakage current in sidewall 214. The dopant material 221 may be one of a p-type dopant and an n-type dopant as discussed above and be operable to mitigate, or altogether eliminate, the occurrence of surface leakage current in the infrared detector 200. For example, in some embodiments, the dopant material 221 may comprise at least one of Zn, Al, magnesium (Mg), Beryllium (Be), boron (B), carbon (C), nitrogen (N), silicon (Si), phosphorous (P), sulfur (S), and tellurium (Te). In other embodiments, the dopant material 221 may be at least one of, or only one of, Zn, Al, Mg, Be, B, C, N, Si, P, S, and Te.

At least a portion of the dopant material 221 of the passivation layer 220 may be diffused into the sidewall 214 or other parts of infrared detector 200 by an appropriate diffusion process. An appropriate diffusion process can include those steps discussed above in relation to FIG. 1 or others known within the art provided the teachings of the present disclosure are observed. As such, the dopant material 221 may be diffused into a part of sidewall 214 and be operable to mitigate, or altogether eliminate, the occurrence of surface leakage current in sidewall 214. This may have the practical effect of electrically isolating or nearly isolating the first contact 216 from the second contact 218 via the sidewall 214.

Figure 2D:
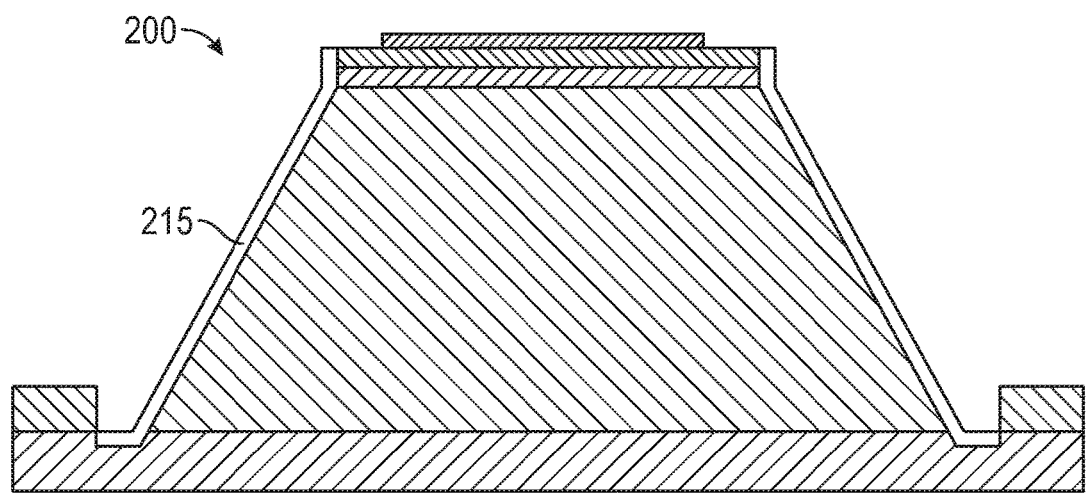

Referring now to FIG. 2D, the infrared detector 200 is depicted with the passivation layer 220 of FIGS. 2B-2C having been removed, leaving behind a passivated sidewall 215. Such removal is optional, and the infrared detector 200 may be operated with the passivation layer 220 still present. Optionally, only a portion of the passivation layer 220 may be removed.

Figure 3A:
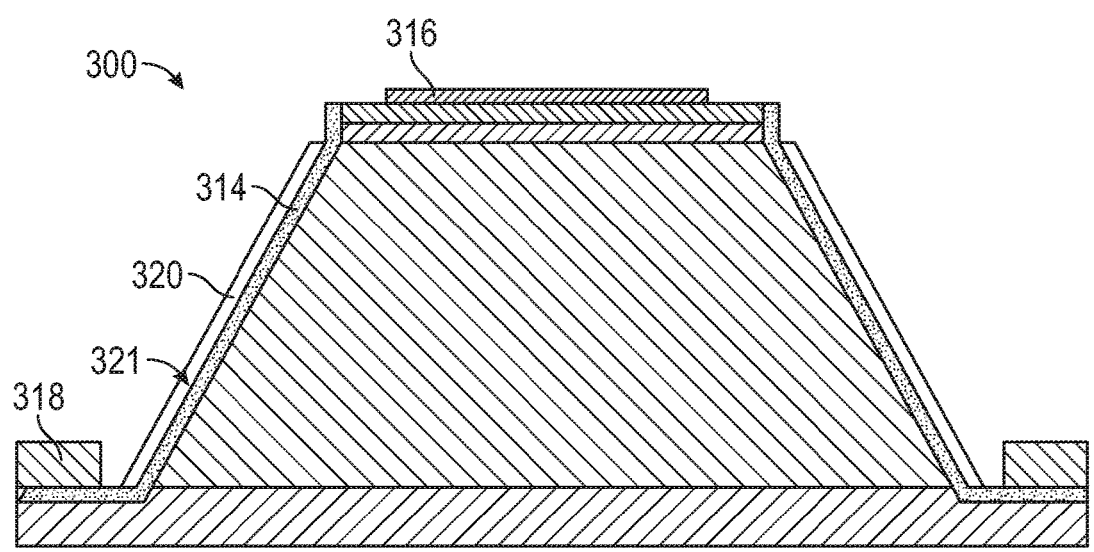
FIGS. 3A through 3C are diagrams illustrating a method of manufacturing an infrared detector according to an embodiment of the invention.
Figure 3B:
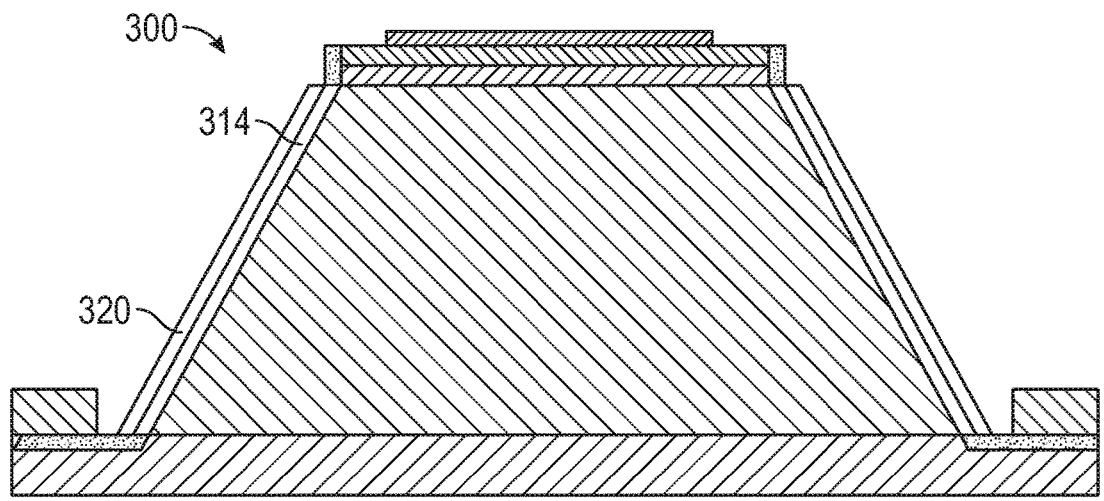
Figure 3C:
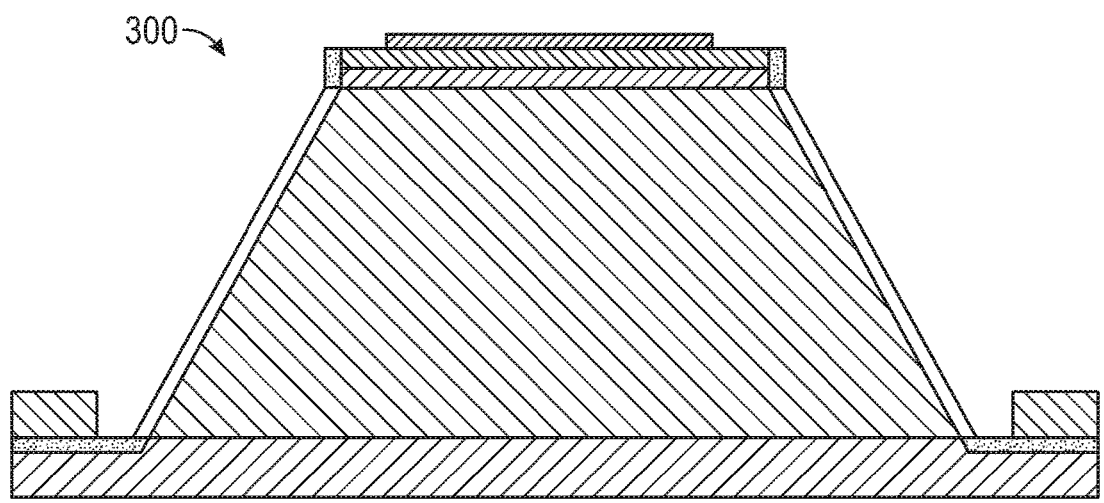

Referring now to FIGS. 3A-3C, an infrared detector 300 according to another embodiment of the invention is presented. The infrared detector 300 comprises all the same elements of the infrared detector 200 of FIGS. 2A-2D, with the distinction of a passivation layer 320 that is positioned on only a portion of a sidewall 314. Accordingly, only a portion of the sidewall 314 has a dopant material 321 of the passivation layer 320 diffused therein. Even though only a portion of the sidewall 314 comprises dopant material 321, the presence of the dopant material 321 may nonetheless electrically isolate or nearly isolate the first and second contacts 316, 318. FIG. 3B depicts an infrared detector 300 with a passivation layer 320 on the sidewall 314. As illustrated in FIG. 3C, the passivation layer 320 may be removed.

Depositing the passivation layer 320 on only a portion of sidewall 314 may be desirable for particular applications. For example, when detector 300 is a heterojunction diode of certain layers, passivation of the entire sidewall 314 may not be necessary. More specifically, in a heterojunction diode having an n-type first semiconductor material as the upper layer and an undoped first semiconductor material as the depletion/barrier layer, but a p-type second semiconductor material as the infrared absorption layer, passivation may be limited to only that portion of sidewall 314 corresponding to the p-type absorption layer. In such a structure, the sidewall 314 is more likely to be n-type and, as the bulk material of the upper layer and the depletion/barrier layer is also n-type, passivating the portion of the sidewall 314 corresponding to these layers is not necessary. Only the portion of the sidewall corresponding to the p-type infrared absorption layer may be passivated using a p-type dopant material to convert it back to p-type. In this manner, after the passivation process, those portions of the sidewall corresponding to each layer will have the same doping as their bulk materials.

As a result of the teachings of the present disclosure, embodiments such as those described above provide advantages over other techniques and devices known in the art. For example, by reducing or eliminating surface leakage current in a surface layer of a photodetector device, more advantageous materials can be used as a part of the device structure, such as a p-type absorption material. An advantage of using a p-type absorption material can be attributed to a considerably higher minority carrier mobility than is available in comparable n-type absorption materials. In p-type materials, the minority carriers are electrons and electron mobility is considerably higher than hole mobility. As a result, higher minority carrier diffusion length and more efficient carrier collection can be achieved if p-type absorption materials are used, making for a more capable photodetector device. Furthermore, when using a p-type absorption material, the thickness of the absorption material can be increased to improve the quantum efficiency of the device. Consequently, embodiments of the present disclosure can significantly improve the capabilities of existing photodetector devices.

Figure 4:
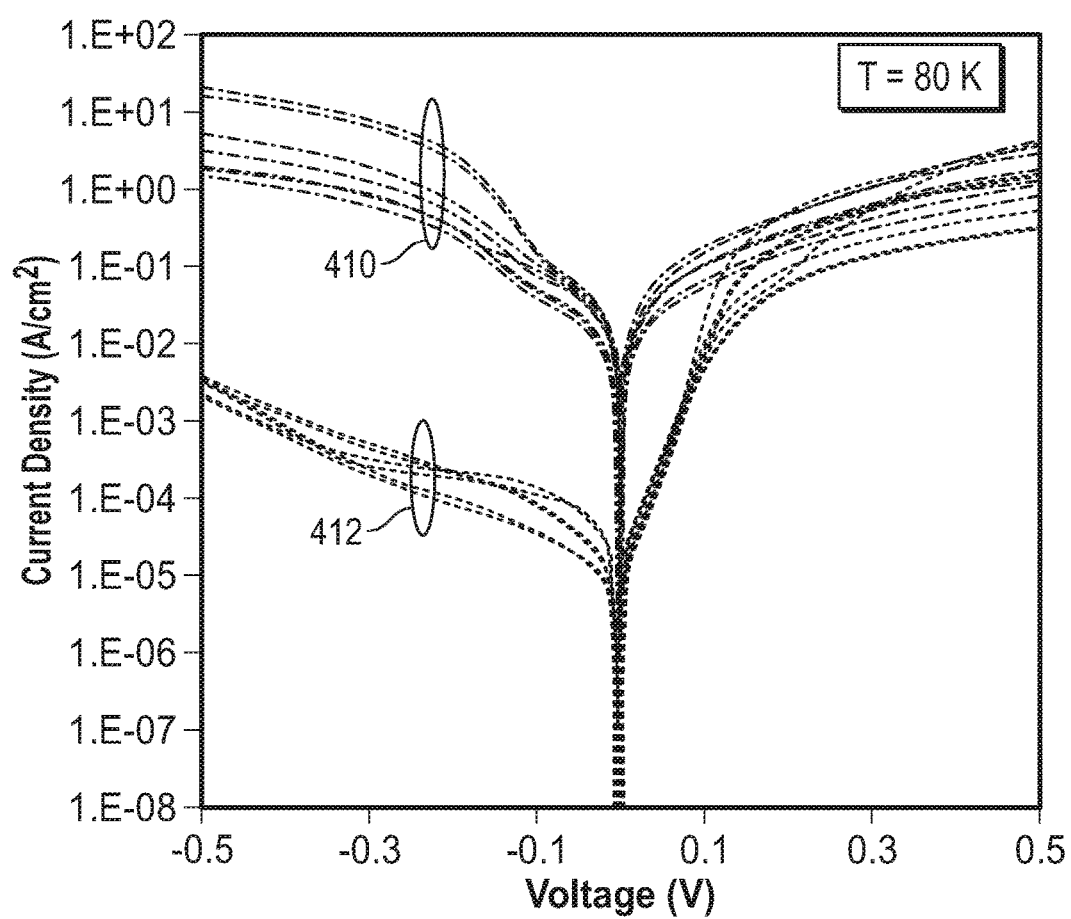
FIG. 4 illustrates a plotting of dark current characteristics for unpassivated detectors and passivated detectors according to an embodiment of the invention.

These advantages are better understood by referring to the exemplary data and test results shown in FIGS. 4-7. In order to test the technique, an infrared detector design comprised of a p-type InAs/InAsSb strained layer superlattice as the absorption material 208 and a bulk n-type InAsSb layer as the top layer 204 was used and grown epitaxially on a GaSb substrate. Using the method 100 described in conjunction with FIG. 1, test detectors were fabricated using a standard wet chemical etching process. A thin ZnO layer (~20 nm) deposited by ALD was used as the passivation layer. As illustrated in FIGS. 2A-2D, the passivation layer 220 was deposited such that it would completely cover the sidewall 214. The detectors were then treated in a rapid thermal annealing at a temperature of 500° C. for a period of 1 minute in a pure nitrogen environment. At the same time, a separate set of detectors to be used as a reference was also fabricated without utilizing the passivation method 100. The dark current characteristics of both set of detectors at different bias voltages were measured and a comparison is shown in FIG. 4. When operated under negative bias voltages, the passivated detectors 412 showed a three orders of magnitude reduction in dark current as compared to the reference detectors (unpassivated) 410. The dark current of the reference detectors 410 was dominated by surface leakage, while the passivated detectors 412 exhibited typical diode characteristics with a reasonable rectification.

Figure 5:
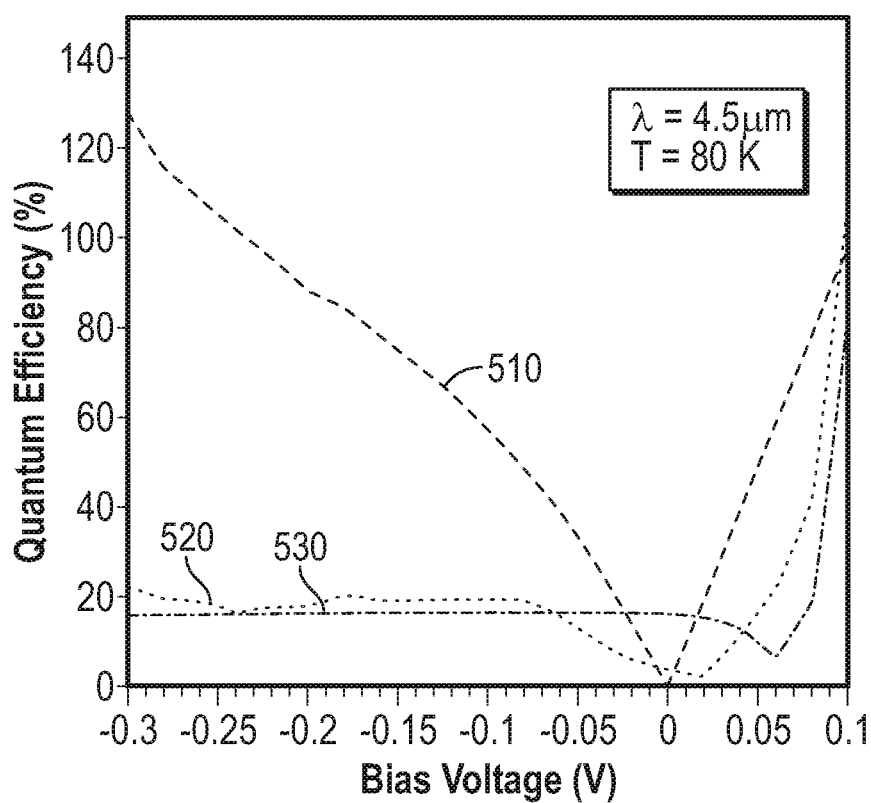
FIG. 5 illustrates a plotting of quantum efficiency for unpassivated detectors, gated detectors, and passivated detectors according to an embodiment of the invention.

Testing the two sets of detectors 410, 412 further, the quantum efficiency was also measured and compared, as shown in FIG. 5. The unpassivated detectors 410 exhibited quantum efficiency 510 of greater than 100%, which is unrealistic and indicative of a dominant surface leakage current in the device. The passivated detectors 412, meanwhile, showed bulk limited quantum efficiency 530 (QE) characteristics as would be expected for a typical photodiode. A fairly constant QE 530 can be observed for the passivated detector under reverse bias operation, and also observed was a photovoltaic behavior under both reverse and forward bias voltages. To confirm the theory of operation for the passivated detectors, a third electrical contact was fabricated on a dielectric layer deposited on the sidewall and a high voltage, referred to as a gate voltage, was applied thereto. Depending on the gate voltage, electrical charge can build along the surface and can be used to suppress the surface leakage current. Thus, even though such an arrangement cannot be practically implemented (this limitation is mainly due to the required gate voltage and the third electrical contact), it can be used to verify the theory behind the passivation method 100. As shown in FIG. 5, the quantum efficiency 520 for the gated detectors is comparable to the quantum efficiency 530 of the passivated detectors.

Figure 6A:
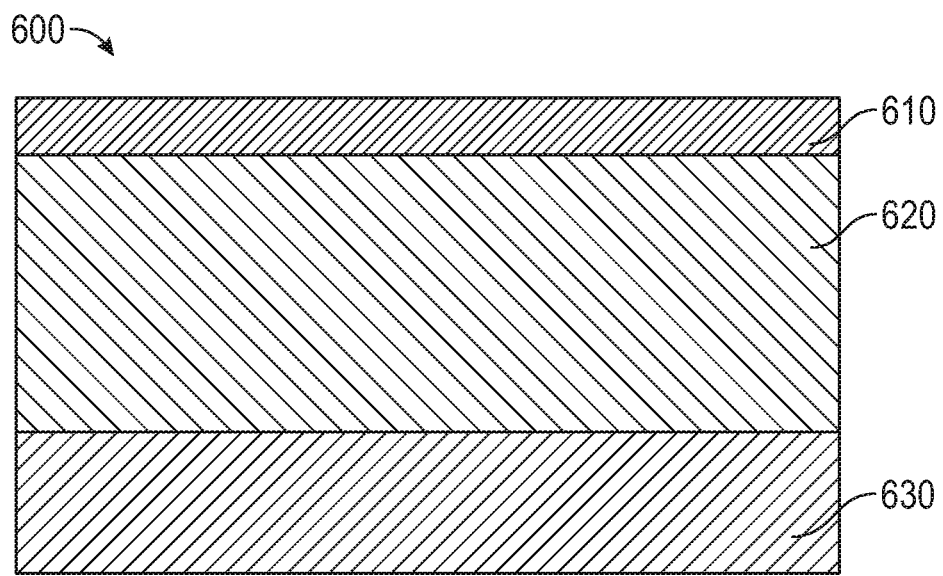
FIGS. 6A through 6C illustrate a process for the fabrication of planar photodiodes using a zinc diffusion process according to an embodiment of the invention.
Figure 6B:
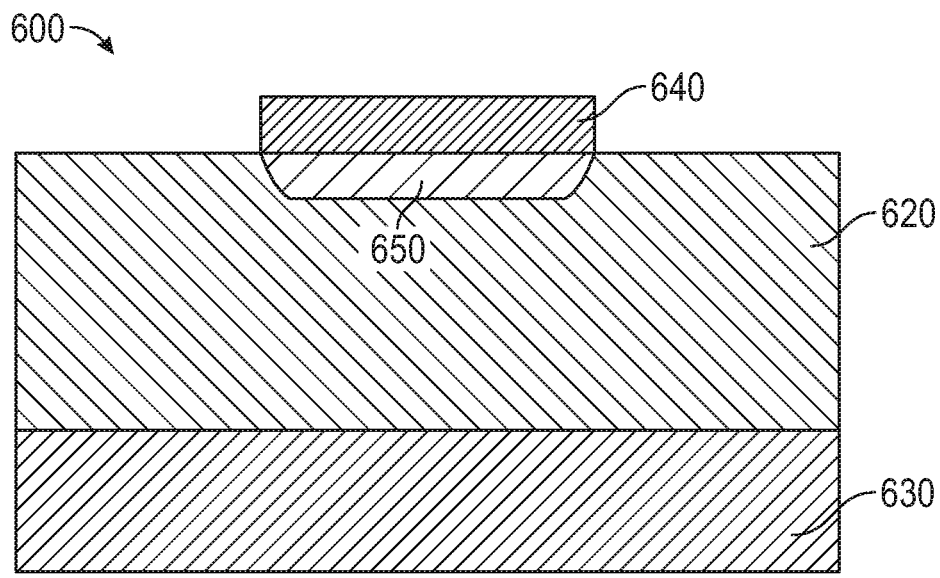
Figure 6C:
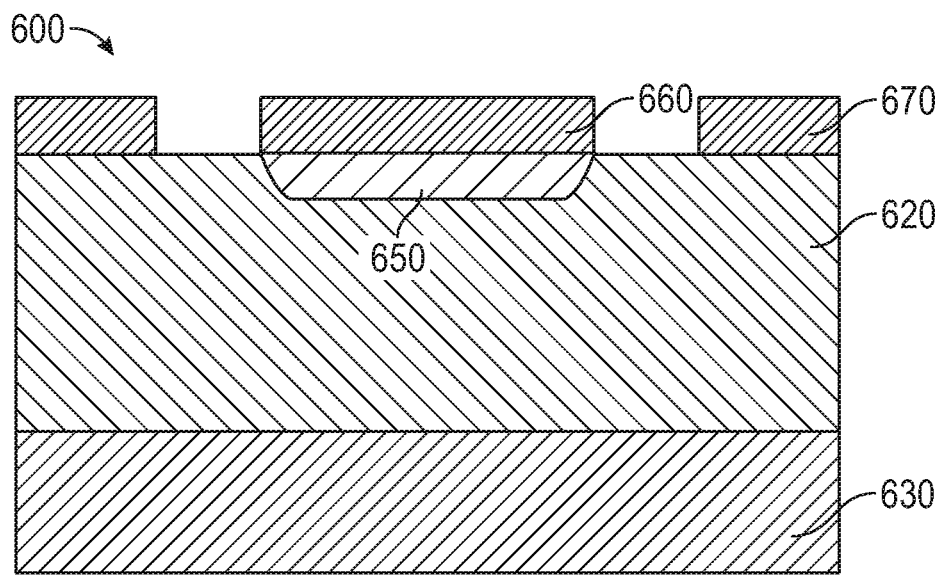

Referring now to FIGS. 6A-6C, a process for fabricating a planar p-n junction diode 600 is presented according to an illustrated embodiment according to the teachings of the disclosure. As shown, an n-type InAs/InAsSb stained layer superlattice was grown on a GaSb substrate 630 to provide an MWIR absorption material 620. ALD was selected as the deposition process for depositing a thin ZnO layer 610 atop the absorption material 620. The ZnO layer 610 was patterned to form a planar mesa pattern 640. While a square mesa pattern is disclosed, all other geometries are contemplated and included within the scope of the invention, including, but not limited to, rectangles, circles, all polygons including regular polygons, and the like. The absorption material 620 may have a thickness of about 2 µm, and the diode 600 may be thermally treated as described above. In the illustrated embodiment, diode 600 may be annealed at 500° C. for 1 minute to diffuse Zn from the patterned ZnO layer 640 into the absorption material 620, which as shown is an n-type superlattice. As such, a thin p-type region 650 can be formed in the area underneath the ZnO square mesa pattern 640. The ZnO layer 640 may then be removed and a first metal contact 660 may be formed directly on the newly created p-type region 650. A second metal contact 670 may be formed on a portion of the absorption material 620 that did not undergo the Zn diffusion process to provide an operable photodiode.

Figure 7A:
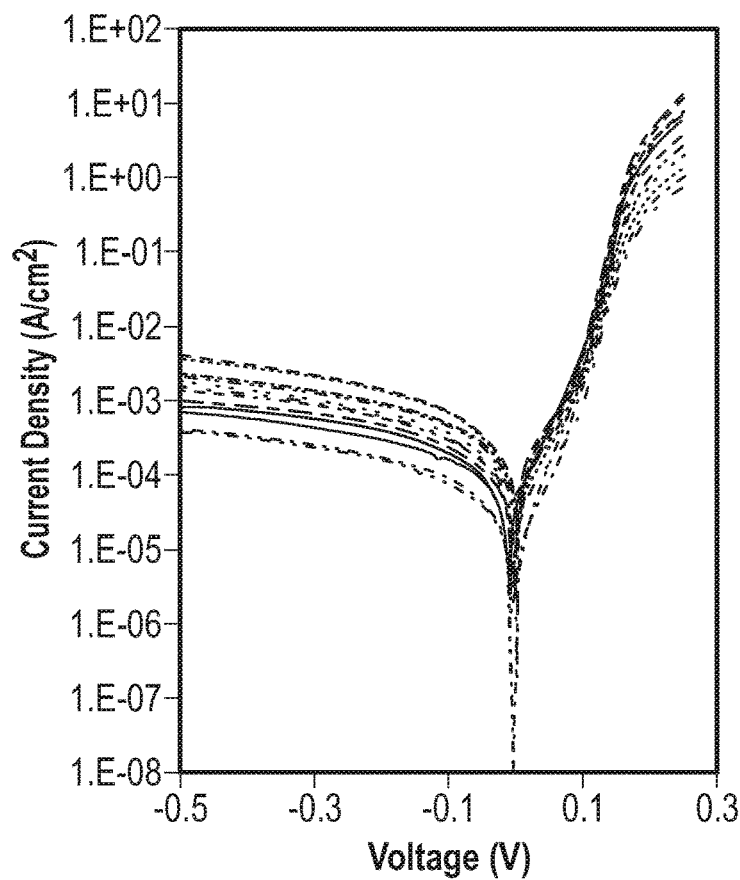
FIGS. 7A and 7B illustrate plottings of dark current characteristics of infrared detectors according to embodiments of the invention.
Figure 7B:
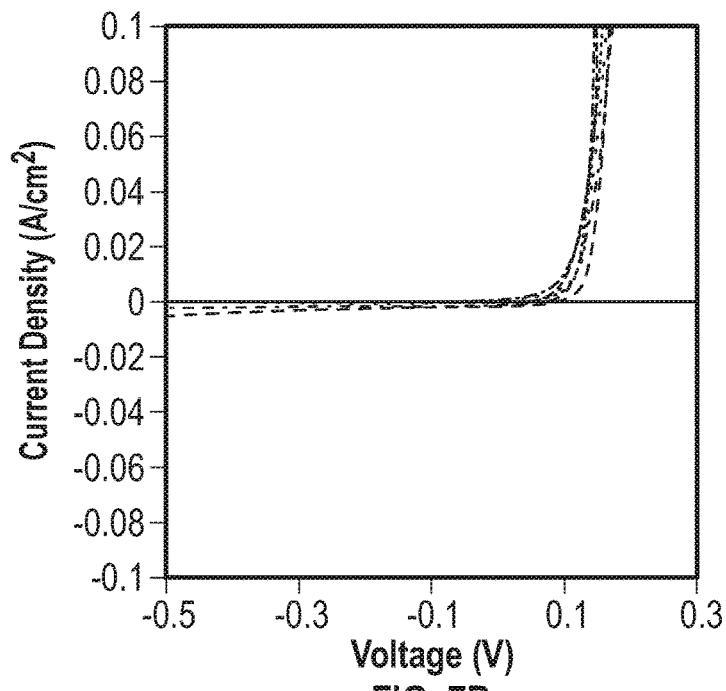

Referring now to FIGS. 7A-7B, semi-logarithmic (7A) and linear (7B) plottings of dark current voltage characteristics were measured across the first and second contacts 660, 670 of the diode 600 fabricated in FIGS. 6A-6C. This test was performed to verify that the diffusion of Zn under the tested conditions and to confirm conversion of the n-type layer into a p-type region. As those skilled in the art will appreciate, the dark current characteristics shown in FIGS. 7A-7B verifies the existence of a p-n junction in the photodiode 600, which was formed due to the diffusion of Zn.

Some of the illustrative aspects of the present invention may be advantageous in solving the problems herein described and other problems not discussed which are discoverable by a skilled artisan.

While the above description contains much specificity, these should not be construed as limitations on the scope of any embodiment, but as exemplifications of the presented embodiments thereof. Many other ramifications and variations are possible within the teachings of the various embodiments. While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best or only mode contemplated for carrying out this invention, but that the invention will include all embodiments falling within the scope of the appended claims. Also, in the drawings and the description, there have been disclosed exemplary embodiments of the invention and, although specific terms may have been employed, they are unless otherwise stated used in a generic and descriptive sense only and not for purposes of limitation, the scope of the invention therefore not being so limited. Moreover, the use of the terms first, second, etc. do not denote any order or importance, but rather the terms first, second, etc. are used to distinguish one element from another. Furthermore, the use of the terms a, an, etc. do not denote a limitation of quantity, but rather denote the presence of at least one of the referenced item.

Thus the scope of the invention should be determined by the appended claims and their legal equivalents, and not by the examples given.

That which is claimed is:

1. An infrared detector comprising:
a detector material comprising an upper layer, a lower layer, and at least one sidewall spanning the upper layer and the lower layer;
a first contact electrically coupled to the detector material through the upper layer; and
a second contact electrically coupled to the detector material through the lower layer;
wherein the at least one sidewall comprises a dopant material that is operable to electrically isolate the first contact from the second contact via the sidewall.

2. The infrared detector of claim 1 wherein the detector material is configured to absorb infrared light within a range of at least one band of short wave infrared (SWIR), mid wave infrared (MWIR), long wave infrared (LWIR), and very long wave infrared (VLWIR) bands.

3. The infrared detector of claim 2 wherein the detector material comprises one of an n-type doped semiconductor, a p-type doped semiconductor, and an undoped semiconductor.

4. The infrared detector of claim 3 wherein the detector material is a III-V bulk semiconductor selected from the group consisting of InAs, InGaAs, InAsSb, and InSb.

5. The infrared detector of claim 3 wherein the detector material is a type II superlattice formed using a semiconductor selected from the group consisting of InAs, GaSb, AlSb, InAsSb, InGaAs, InAlAs, AlAsSb, AlGaSb, and InAlSb.

6. The infrared detector of claim 1 wherein the dopant material comprises one of a p-type dopant and an n-type dopant.

7. The infrared detector of claim 6 wherein the dopant material comprises at least one of Zn, Al, Mg, Be, B, C, N, Si, P, S, and Te.

8. The infrared detector of claim 1 wherein the dopant material is diffused into at least a portion of the sidewall from a passivation layer deposited on the at least a portion of the sidewall.

9. A method of passivating an infrared detector comprising a detector material having a surface layer, the method comprising:
providing an infrared detector characterized by a surface leakage current;
depositing a passivation layer comprising a dopant material onto at least a portion of the surface layer; and
diffusing the dopant material into the detector material via a passivation process;
wherein the dopant material diffused into the detector material reduces the surface leakage current.

10. The method of claim 9 wherein the passivation layer comprises one of a p-type dopant and an n-type dopant.

11. The method of claim 10 wherein the passivation layer comprises one of ZnO, ZnS, MgO, $Al_2O_3$, AlN, SiO2, $Si_xN_y$, and $HfO_2$.

12. The method of claim 9 wherein the detector material comprises one of an n-type doped semiconductor, a p-type doped semiconductor, and an undoped semiconductor.

13. The method of claim 12 wherein the detector material is a bulk semiconductor selected from the group consisting of InAs, InGaAs, InAsSb, and InSb.

14. The method of claim 12 wherein the detector material is a type II superlattice formed using a semiconductor selected from the group consisting of InAs, GaSb, AlSb, InAsSb, InGaAs, InAlAs, AlAsSb, AlGaSb, and InAlSb.

15. The method of claim 9 comprising depositing the passivation layer by at least one of atomic layer deposition, pulsed laser deposition, chemical vapor deposition, plasma enhanced chemical vapor deposition, vapor coating, thermal evaporation, and sputtering.

16. The method of claim 9 further comprising diffusing the dopant material from the passivation layer by at least one of thermal annealing, ion implantation, heating in an ampoule under vacuum, and heating the infrared detector in an inert gas environment.

17. The method of claim 16 wherein thermal annealing comprises heating the passivation layer to a temperature within a range from about 100 degrees C. to about 600 degrees C.

18. The method of claim 16 wherein thermal annealing comprises heating the passivation layer to about 500 degrees C. for a period of one minute in a nitrogen environment.

19. The method of claim 9 further comprising removing the passivation layer by at least one of a wet etching and a dry etching process.

* * * * *